US008558544B2

(12) United States Patent
Grenier

(10) Patent No.: US 8,558,544 B2
(45) Date of Patent: Oct. 15, 2013

(54) MRI SPATIAL ENCODING USING HYPERCOMPLEX NUMBERS

(75) Inventor: Denis Grenier, Lyons (FR)

(73) Assignee: Centre National de la Recherche Scientifique (CNRS), Paris (FR)

( * ) Notice: Subject to any disclaimer, the term of this patent is extended or adjusted under 35 U.S.C. 154(b) by 580 days.

(21) Appl. No.: 12/678,254

(22) PCT Filed: Sep. 18, 2008

(86) PCT No.: PCT/EP2008/062480
§ 371 (c)(1),
(2), (4) Date: Mar. 15, 2010

(87) PCT Pub. No.: WO2009/037326
PCT Pub. Date: Mar. 26, 2009

(65) Prior Publication Data
US 2010/0213936 A1   Aug. 26, 2010

(30) Foreign Application Priority Data

Sep. 18, 2007 (FR) ..................................... 07 57654

(51) Int. Cl.
*G01V 3/00* (2006.01)
*G06K 9/54* (2006.01)
(52) U.S. Cl.
USPC ............ 324/307; 324/309; 324/320; 382/128
(58) Field of Classification Search
USPC .......................... 324/300–322; 382/128–133; 600/407–464
See application file for complete search history.

(56) References Cited

U.S. PATENT DOCUMENTS

| 4,307,343 | A  |   | 12/1981 | Likes |
| 5,998,996 | A  | * | 12/1999 | Bernstein et al. ............. 324/309 |
| 7,358,729 | B2 | * | 4/2008  | Ma et al. ....................... 324/307 |
| 2004/0217760 | A1 | * | 11/2004 | Madarasz et al. ............. 324/307 |
| 2006/0273797 | A1 | * | 12/2006 | Fiorito et al. ................. 324/318 |
| 2009/0148068 | A1 | * | 6/2009  | Woodbeck ..................... 382/305 |

OTHER PUBLICATIONS

Granwehr et al: "Sensitivity quantification of remote detection NMR and MRI", Journal of Magnetic Resonance, Academic Press, Orlando, FL. US, vol. 179, No. 2, Apr. 2006, pp. 280-289, XP005358683, ISSN: 1090-7807.

Chen J et al.: "Ultra-high resolution 3D NMR spectra from limited-size data sets", Journal of Magnetic Resonance, Academic Press, Orlando, FL, US., vol. 169, No. 2. Aug. 2004, pp. 215-223, XP004521440, ISSN: 1090-7807.

Kazimierczuk et al: "Two-dimensional Fourier transform of arbitrarily sampled NMR data sets", Journal of Magnetic Resonance, Academic Press, Orlando, Fl, US, vol. 179, No. 2. Apr. 2006, pp. 323-328, XP005358690, ISSN: 1090-7807.

(Continued)

*Primary Examiner* — Jermele M Hollington
*Assistant Examiner* — Emily Chan
(74) *Attorney, Agent, or Firm* — Harness, Dickey & Pierce, P.L.C.

(57) ABSTRACT

Processing a complex signal includes acquisition of a signal in the form of complex numbers; determination, on the basis of the complex signal acquired, of an associated hypercomplex signal having a component which is the complex signal and at least one component that is a time derivative of the phase of the required complex signal; processing of the hypercomplex signal so that the resulting signal from the processing comprises a greater number of components than the number of components of the acquired signal.

4 Claims, 3 Drawing Sheets

(56) References Cited

OTHER PUBLICATIONS

E. Kupce et al: "Projection-Reconstruction Technique for Speeding up Multidimensional NMR Spectroscopy", J. Am. Chem. Soc., vol. 126, 2004, pp. 6429-6440, XP002478115.

Y. M. Kadah et al: "A New Model-Based Algebraic Solution to the Gridding Problem", Proc. Intl. Soc. Mag. Reson. Med. 10, 2002, p. 2425, XP002478116.

* cited by examiner

MRI SPATIAL ENCODING USING HYPERCOMPLEX NUMBERS

CROSS-REFERENCE TO RELATED APPLICATIONS

This application is a National Phase Entry of International Application No. PCT/EP2008/062480, filed on Sep. 18, 2008, which claims priority to French Application 0757654, filed on Sep. 18, 2007, both of which are incorporated by reference herein.

GENERAL TECHNICAL FIELD

The present invention relates to the acquisition and processing of signals by means of hypercomplex numbers and advantageously finds application in the field of nuclear magnetic resonance.

STATE OF THE ART

General Theoretical Points on Signal Processing in Nuclear Magnetic Resonance Nuclear magnetic resonance (NMR) is a technique which allows the removal of the degeneration of a complex system i.e. determining for the latter the molecules present, their amounts and their positions in space. In an NMR experiment, whichever it may be, a signal is acquired as an implicit or explicit time function.

The measured quantity is magnetization, the sum of rotational magnetic moments, the NMR signal noted as dS created by a small differential element is given by the following relationship $$dS(x,y,z,\nu,t) = \rho(x,y,z,\nu,t)e^{if(x,y,z,\nu,t)},$$

wherein $\rho(x,y,z,\nu,t)$ represents the sought quantity, i.e. the spin density of the nucleus observed in position $(x,y,z)$, $\nu$ is introduced in order to take into account the fact that the frequency of rotation of the magnetic moments may be modified by a screen factor depending on the chemical surroundings (NMR spectroscopy), $f(x,y,z,\nu,t)$ is known and defined as an implicit or explicit time function. The signal $dS(x,y,z,\nu,t)$ is complex (an element of the field of complex numbers) since it represents the intensity and the phase of a rotational magnetic moment.

If the sample is considered as a whole, the total acquired signal is proportion to $$S(t) = \iiiint_{\Delta x \Delta y \Delta z \Delta \nu} \rho(x,y,z\nu) \cdot e^{if(x,y,z,\nu,t)} dxdydzd\nu,$$

wherein
- $\Delta x, \Delta y, \Delta z, \Delta \nu$ are the integration limits of the signal along the x, y, z and frequency directions, respectively;
- the signal $S(t)$ is a complex signal and is seen as the sum of complex signals.

It is crucial to note that each point of the acquired signal has two components: an intensity component and a phase component. Both of these components are measured throughout the acquisition, the measured phase is expressed in radians and is therefore dimensionless. With NMR, from the acquired signal as a function of time, it is possible to determine a (or the) function $\rho(x,y,z,\nu,t)$ which generated it.

In particular, with NMR, it is possible to reconstruct an image from the acquired signal, each point of the acquired signal corresponds to a point of the image object, for example the body of a patient. Reconstructing the image from the signal in fact amounts to solving an equation system of the type: $S(t)=S(t)=M\rho(x,y,z,\nu,t)$ wherein S is a known vector, the elements of which are complex numbers, the intensity and phase of which are known and given by the sampling of the signal over time, $\rho$ is the vector to be determined and M is a matrix, the elements of which are themselves also known since they are defined by the experimental conditions.

Each element of each line of the matrix M is represented by the phase of each element of the volume to be reconstructed at a given acquisition time. For this purpose, conventional reconstruction of an NMR image is accomplished by using the possibility of rewriting the function $f(x,y,z,\nu,t)$ as $$f(t) = k_x(t) \cdot x + k_y(t) \cdot y + k_z(t) \cdot z + k_\nu(t) \cdot \nu$$

Indeed, under these conditions, as an exponential is dimensionless, the values $k_x(t), k_y(t), k_z(t), k_\nu(t)$ are the conjugate variables of $x,y,z,\nu$ and $S(t)$ may be rewritten as $k_x(t), k_y(t), k_z(t), k_\nu(t))$. S and $\rho$ are related through Fourier transform(s).

Thus, the goal of NMR acquisition is to ensure that the acquired signal $S(t)$ may be put into the form of $S(k_x,k_y,k_z,k_\nu)$. This condition is met for NMR imaging by "scanning" the k space (or further the Fourier space) by means of magnetic field gradients which will allow acquisition of a sufficient number of points of coordinates $k_x, k_y, k_z, k_\nu$ so that a volume may be reconstructed in the $x,y,z,\nu$ space and the degeneration of the acquired signal may thereby be lifted. Thus, the possibility of rapidly acquiring images with high spatial resolution is conditioned by the possibility of rapidly covering the k space and over a wide range of frequencies (gradients of intense fields and switching rapidly).

FIGS. 1a and 1b illustrate the scanning of the k-space within the scope of an "Echo Planar Imaging" sequence in the case of a 2D image. During this sequence, the transverse magnetization is generated by the radiofrequency RF (see FIG. 1a). The K points of the acquired signal over time between the marks 1 and N represent the signal $S(t)$. Application of the gradients $G_x(t)$ and $G_y(t)$ causes the signal $S(t)$ to follow a Cartesian grid in k-space (see FIGS. 1a and 1b).

In this sequence, as in any present NMR experiment, the information actively injected into the signal is limited to the phase of the magnetizations over time. The magnetizations undergo phase variations over time as well as variations of velocity and even acceleration but the only measured component is the phase. It should be noted that each measured magnetization corresponds to a point of the object to be imaged, the patient for example.

The dual Fourier transform performed on the signal rewritten beforehand as $S(k_x,k_y)$ is (just) a mathematical trick with which the system may be solved very easily and thus making it possible to pass from $S(k_x,k_y)$ to $\rho(x,y)$. The degeneration of the acquired signal is substantially lifted with a residual error rate which is very small, of the order of the size of a pixel for example. It should be noted (FIG. 1) that extremely rapid variations are imposed to the gradients along x between the maximum positive and negative amplitudes (they may have to switch between values of +1 Tesla/m to −1 Tesla/m at a frequency close to 1 kHz).

Problems of the State of the Art

The limits of the operating procedure described above are those dictated by the Heisenberg equations (uncertainty principle). The space resolution in a space $(x,y,z,\nu)$ is inversely proportional to the space resolution in the conjugate space $(k_x,k_y,k_z,k_\nu)$. Both space and time resolutions depend on the available time before the signal disappears (a parameter intrinsic to each tissue) as well as on the intensity of the field gradients which may be applied for encoding the signal (a parameter intrinsic to the machine used, limitations introduced by the hardware, constraints imposed by the safety standards for patients). Thus, in order to scan the k-space, extremely rapid variations are imposed to the gradients along x: the gradients may have to oscillate between their limiting values (of the order of one Tesla per meter) at frequencies of the order of one kHz.

This phenomenon generates very strong acoustic noise, which may cause irreversible lesions of the eardrum in patient placed in the field during the NMR experiment. Further, for strong gradient intensities, this oscillation causes harmful direct nerve stimulations (smarting, pins and needles in the fingers). Further, the time during which the signal may be acquired is generally limited to two or three hundred milliseconds, thus the radiofrequency pulses being used for generating the observable signal have to be repeated in order to acquire images. Such a repetition induces localized heating up of the tissues (specific absorption rates (SAR), which may be dangerous for the body.

Finally, certain tissues of the body (cartilages, tendons, bones, . . . ) are characterized by a short relaxation time. For these tissues, the signal can only be acquired over a very short period (of the order of ten microseconds for bone). This specificity greatly limits the maximum spatial resolution which may be attained, or even bluntly prevents viewing of the tissues (i.e. the bones).

At the expense of many drawbacks, with NMR, it is possible to lift the degeneration of an acquired signal by scanning the k-space, such scanning applies complex numbers and trajectories scanning the space, generating the aforementioned drawbacks. The acquired signal is a sequence of complex numbers, each point of the signal represents an amplitude and phase and cannot represent anything more. Indeed, it is only able to carry two pieces of information, one in its real part, one in its imaginary part or further in the more specific case of interest to us: one in its amplitude and only another one in its phase. Thus for example, two points characterized by the same phase are after reconstruction assimilated to a same point. The reconstructed signal is then degenerated, even if the relevant points were further characterized by very different velocities or accelerations.

SUMMARY

The invention proposes an original approach for lifting the degeneration of a signal. For this purpose, the invention is based on the fact that by using a "superior" form to that of a sequence of complex numbers, it is possible to lift the degeneration of an acquired signal. In order to define a signal, much more information may be injected into the latter in each point than only the phase information. In the present invention, the term of hypercomplex number is used for designating both quaternions and octonions and the elements which are defined by a Clifford algebra as well as those of the algebras which are extended or which go beyond the algebra of complex numbers.

According to a first aspect, the invention relates to a method for processing a complex signal comprising: acquisition of a signal as complex numbers; determination from the acquired complex signal of the associated hypercomplex components, said components corresponding to at least time derivatives of the phase of the acquired complex signal; a processing operation on the hypercomplex signal being determined so that the signal resulting from the processing comprises a number of components greater than the number of components of the acquired signal. Other aspects of the method are the following:

- it comprises, prior to the acquisition, an encoding of an object with at least two dimensions in a determined space.
- with each encoded space dimension is associated a polynomial formed by a linear combination of the different derivatives used for coding the space, the polynomials associated with two orthogonal dimensions being orthogonal.
- the encoding consists in creating characterizing information for each point of the signal of the space determined in the form of time derivatives of each point of the signal so that, with each point of the coded space is associated a hypercomplex number, the components of which are the values of the different time derivatives spatially characterizing this point.
- with each point of the acquired signal is associated a hypercomplex number, the components of which are the different time derivatives of the signal used for coding the space.
- it further comprises a decoding step consisting of determining from the signal the spatial density of the points by solving in a hypercomplex space, a linear system of equations formed by the hypercomplex vector formed by the acquired signal on the one hand, and by the hypercomplex matrix for coding the points of the space described on the other hand;
- the method is applied in a nuclear magnetic resonance system, the signal to be processed being a nuclear magnetic resonance signal
- the encoding is carried out by means of magnetic field gradients.

According to a second aspect, the invention relates to a nuclear magnetic resonance imaging system. The device of the invention is characterized in that it comprises means for applying the method according to the first aspect of the invention.

The use of hypercomplex numbers for reducing the degeneration of a system has already been described within the scope of nuclear magnetic resonance for example by:

E. Kupce et al., "*Projection reconstruction technique for speeding up multidimensional NMR spectroscopy*", (J. Am. Chem. Soc., Vol. 126, 2004, p. 6429-6440);

Kazimierczuk et al., "*Two dimensional Fourier transform of arbitrary sample NMR data sets*", JMR 179, 2006, p. 323-328;

Chen J. et al., "*Ultra High resolution 3D NMR spectra from limited-size data sets*", JMR, No. 169, 2004, p. 215-224;

Granwher et al., "*Sensitivity quantification of remote detection NMR and MRI*".

In all the cases described above, hypercomplex numbers are used for storing the same information: a phase, each component of these hypercomplex numbers containing the phase of the signal at given instants or in the case of the Granwher publication after a given "time of flight".

In our method, the fact that each component of the acquired hypercomplex signal is intrinsically of different nature (phase, velocity, angular acceleration, . . . ) along the coded space dimension (and no longer of the type, phase, phase, phase, . . . , whichever the dimension, as presently described in the literature) allows much greater reduction as compared with all the other methods, of the degeneration problem of the space position of the magnetizations.

Advantages of the Invention

By processing the signal by means of hypercomplex numbers, it is possible to get rid of the notion of k-space. In all prior studies and even in present studies, no longer using Fourier transforms, the notion of reciprocal space (k-space) is nonetheless used. All prior studies impose that the trajectory scans a plane or volume of interest in the reciprocal space. As this volume has the same number of dimensions as the volume to be coded, i.e. for coding a three-dimensional object (x,y,z), a volume of the three-dimensional reciprocal space (kx, ky,kz) has to be presently acquired.

If hypercomplex numbers and moments for coding the object are used, the coding of the space information is accomplished at each point and no longer requires that the trajectory scans a volume of same dimensionality as the object to be coded. This new approach therefore allows great simplification of the trajectories used for coding an object. In the conventional approach, each point of the acquired trajectory is defined by a complex number therefore having two dimensions, a real dimension and an imaginary dimension (one refers to the complex plane). Each point of this trajectory characterizes the phase and the amplitude of the signal at a given instant.

In order that a volume may be reconstructed, the trajectory of the acquired signal over time should follow a volume in a space of same dimensionality N as the object to be coded. The total number of independent dimensions used for coding an object with N dimensions is therefore 2 N which represents the dimensionality of complex numbers positioned in a space with N dimensions. In the proposed method, each acquired point is a hypercomplex number with dimensionality (2 N), each component pair of which no longer just represents magnetization amplitudes and phases but also amplitudes and angular velocities, amplitudes and angular accelerations, etc. The dimensionality of the acquired points already being 2 N and the information contained in each component being of different dimensionalities, the minimum dimensionality of the trajectory with which a volume of dimensionality N may be reconstructed, then drops again to 1.

Thus, with the invention it is possible:
- to greatly increase the flexibility in how the information is injected during the encoding into a signal (which will be processed in hypercomplex form);
- to reduce or even totally suppress acoustic noise; during NMR image acquisition to pass in certain cases from more than 120 dB to values below 20 dB;
- to reduce, or even suppress direct nerve stimulations in the patient;
- to reduce heating-up of the tissues of the patient;
- to improve time resolution of the NMR images;
- to improve space resolution of the NMR images.

Within this scope, it is possible to entirely encode an image or a volume without having to use intense gradients and without having to switch them very rapidly. Thus, with the present invention, it is possible to acquire and reconstruct, notably images or volumes, by using hypercomplex numbers, this within a scope which is no longer limited by the Heisenberg equations. In particular, the ratio between the acquisition time and the space resolution is advantageous as compared with the known techniques. Moreover, the method of the invention is particularly well integrated into NMR devices of a known type.

BRIEF DESCRIPTION OF DRAWINGS

Other features and advantages of the invention will become further apparent from the description which follows, which is purely illustrative and non-limiting, and should be read with reference to the appended drawings wherein in addition to FIGS. 1a and 1b already discussed.

DETAILED DESCRIPTION OF A PARTICULAR EMBODIMENT

Figure 1:
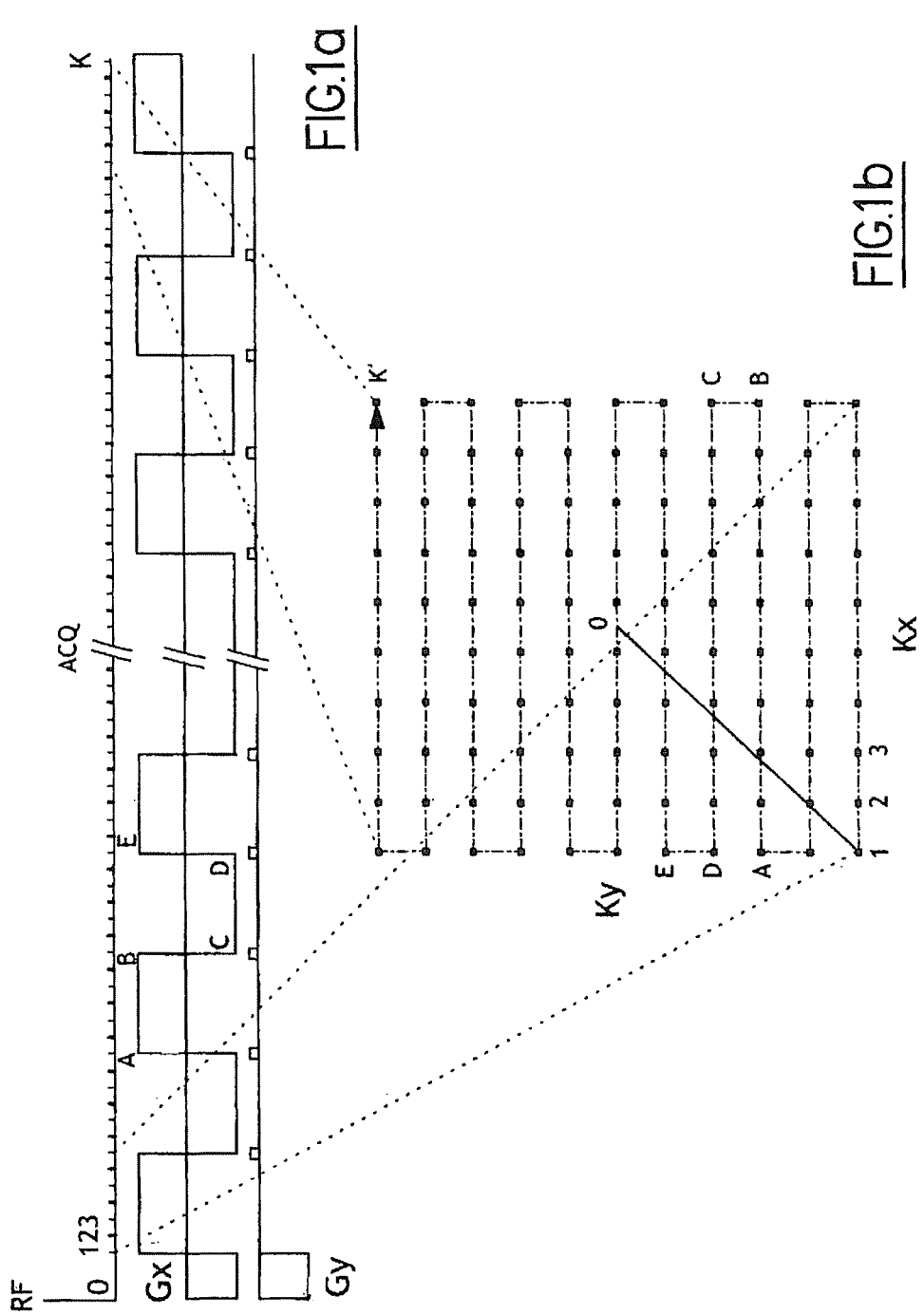
Figure 2:
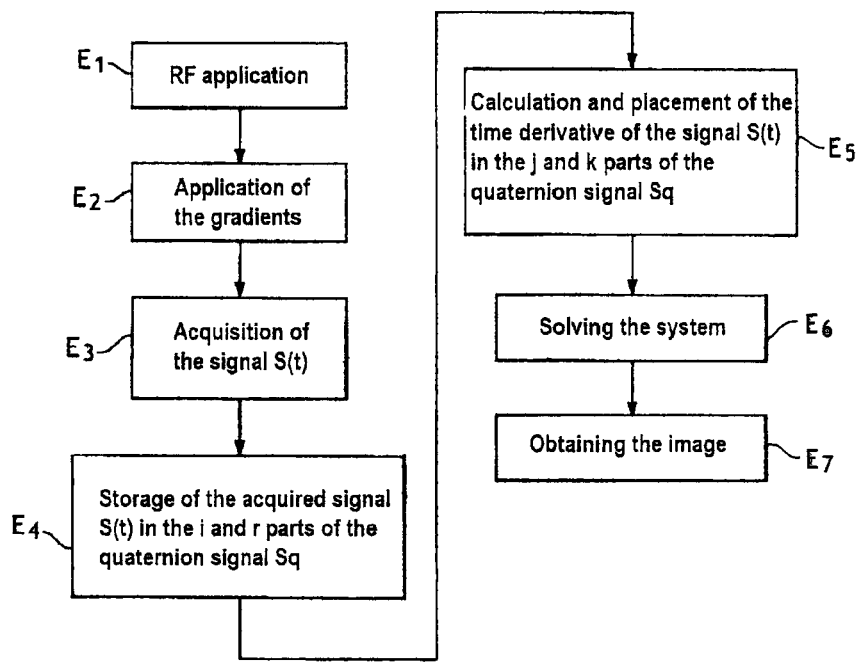
FIG. 2 illustrates a flowchart of the method of the invention.

FIG. 2 illustrates a flowchart of the method for acquiring an NMR signal using hypercomplex numbers with four dimensions, i.e. quaternions. Within the scope of the NMR application, an object to be coded is placed in a magnetic field. The case here is when it is sought to code the object according to two dimensions. In order to code this object as a time signal, a radiofrequency signal (RF) E1 is applied, which will be used for generating the observable magnetization and for scanning the two-dimensional space, E2 is applied along two dimensions, magnetic field gradients which will then modulate the characteristics of the magnetization (phase, rotational velocity, acceleration, . . . ) of each small differential element depending on its position.

Figure 3A:
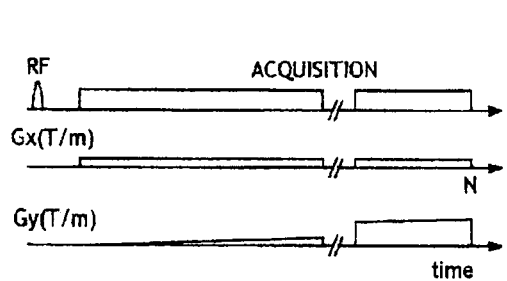
FIGS. 3a and 3b illustrate what would be in k-space, a trajectory (parabolic trajectory in k-space) used in the method of the invention.
Figure 3B:
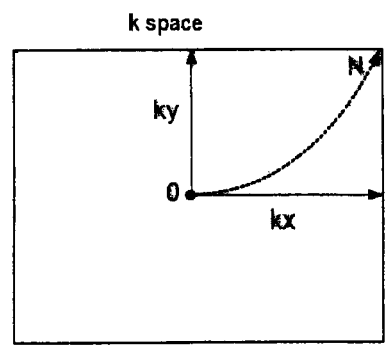

FIG. 3b illustrates a scan of the k-space by applying the gradients of FIG. 3a. Along the direction x, a constant magnetic field gradient is applied: along this dimension, the rotational frequency of the magnetizations becomes a linear function of their position. Along the direction y, a magnetic field gradient is applied as a ramp: along this dimension, the acceleration of the rotational velocity of the magnetizations becomes a linear function of their position. Therefore, in the conventional representation using the notion of k-space, the trajectory for covering the space to be coded is parabolic (see FIG. 3b).

More specifically, the constant magnetic field gradient allows information to be injected into the signal, on the rotational velocity of the magnetizations depending on their position along a first direction and the ramp-shaped magnetic field gradient allows information to be injected into the signal on the acceleration of the rotational velocities of the magnetizations depending on their position along the second direction. The acquisition of this single parabolic trajectory is sufficient for allowing reconstruction of the image. In comparison with conventional techniques, the trajectory used for covering the space to be coded is much simpler.

Further, the magnetic field gradients used have very low variations of intensity, which causes very significant reduction of the noise generated by the signal acquisition process as well as of the energy required for generating them. Further, the acquisition time may be shorter than with conventional techniques, by which it is possible to avoid heating-up of the tissues and nerve stimulations which are harmful to the body. The acquired signal E4 is used in the hypercomplex form.

In practice, it may be acquired by using an antenna coupled with differentiating circuits or else by using antennas directly giving differentiated signals. In this example, a hypercomplex signal with four components is used, in this case, this is a quaternion. A quaternion comprises four components. A real component noted as r, an imaginary component noted as i and two other components noted as j and k. The four components of the quaternion signal are related with each other through the relationship $i^2 = j^2 = k^2 = i.j.k = -1$.

The acquired signal as a quaternion has the expression:

$$S(t) + jR(S(t)) + kI(S(t)) = \iiint_{\Delta x \Delta y \Delta z \Delta v} \rho(x,y,z) \left( e^{if(t)} + jR\left(\frac{de^{if(t)}}{dt}\right) + kI\left(\frac{de^{if(t)}}{dt}\right) \right) dx\, dy\, dz\, dv$$

wherein S(t) represents the complex component of the signal (as in the known technique) and S(t) represents the time derivative of S(t). The operators R and I respectively assume the real and imaginary parts of the signal. In this expression of the acquired signal, the function f(t) represents the trajectory used for covering the space to be coded.

For this purpose, polynomial trajectories are for example used expressed as:

$$f(t) = \sum_{n=i}^{j} a_n x_n t^n,$$

for which the index n represents the dimensions to be code. Other trajectories may be used, the only constraint is that the trajectory used may actually "sufficiently" lift the degeneration of the signal, i.e. the covered trajectory brings sufficient information into the equation system to be solved so that by solving the latter, information may be obtained which is useful to the desired localizations (whether the information is completely degenerated outside the object which is of interest to us, of course has no significance). The trajectories may for example be themselves polynomials under the only condition that the corresponding polynomials corresponding to orthogonal directions are themselves orthogonal.

More specifically in the example which we are describing, the acquired signal is expressed as, depending on the applied magnetic field gradients:

$$S(t) = \int_{-\infty}^{+\infty} \int_{-\infty}^{+\infty} \rho_{x,y} e^{i(2\pi\gamma G_x xt + 2\pi\gamma G_y(t)yt)} dx\, dy,$$

the factors $2\pi$ and $\gamma$ being introduced for dimensionality reasons between the Hz and Hz/T, T/m, T/m/s.

By replacing $G_y(t)$ by $G_y t$, the previous expression becomes $$S(t) = \int_{-\infty}^{+\infty} \int_{-\infty}^{+\infty} \rho_{x,y} e^{i(2\pi\gamma G_x xt + 2\pi\gamma G_y yt^2)} dx\, dy,$$

or further $$S(t) = \int_{-K_x}^{+K_x} \int_{-K_y}^{+K_y} \rho_{x,y} e^{i(2\pi\gamma G_x xt + 2\pi\gamma G_y(t)yt)} dx\, dy.$$

As this is illustrated in FIG. 3b, the parabolic trajectory used for covering the k-space does not allow a uniform scan of the k-space, the points which are not reached are zero in this case. As this was seen above, the acquired signal may be expressed as $S(t)=M\rho(x,y)$ for which S(t) and $\rho(x,y)$ are vectors, and M is a matrix. If it is attempted to pass from the acquired signal S to the density function $\rho$ by using the notion of a k-space, the information which we have injected into the signal can neither be recovered nor used and the reconstruction gives for $\rho$ totally "odd" values. In particular, in the example shown, only the phase of the signal is used by the k-space/Fourier transform approach and the only way to reconstruct the image is to also use the information on the velocity which we have carefully coded in the signal. As compensation, this approach requires direct resolution of the hypercomplex linear equation system.

Figure 4A:
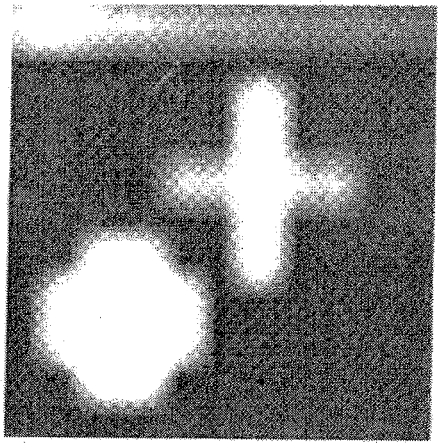
FIG. 4a illustrates the image to be coded (the system), and FIG. 4b views in the k space, the trajectory used during the method of the invention.
Figure 4B:
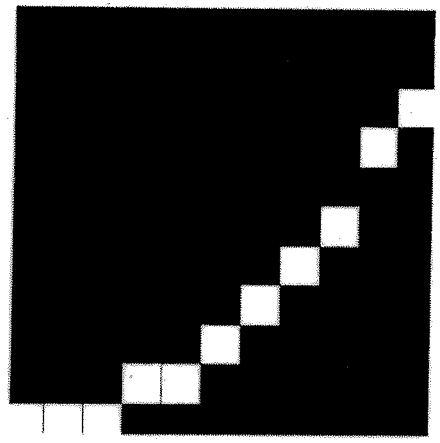

FIG. 4a illustrates the object which is intended to be coded. FIG. 4b illustrates (in k-space) the real part of the signal acquired by applying a constant gradient along the direction x and a ramp along the direction y (parabolic trajectory). The only points containing (non-zero) information are those placed on the parabolic trajectory.

Figure 5A:
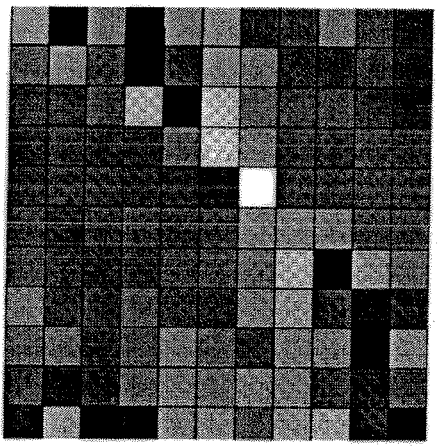
FIGS. 5a and 5b illustrate the reconstructed image after decoding by using the Fourier transform as this is known and the one obtained by the method of the invention respectively.

FIG. 5a illustrates the image obtained by using Fourier transforms: in this example, the conditions for using the Fourier transform require that the information be distributed on a plane. The fact that the acquired information cannot be put in this form prevents it from being properly used, the reconstructed image is by no means comparable with the original image. In this case, the more than degenerated reconstructed image is totally different from the coded image.

Figure 5B:
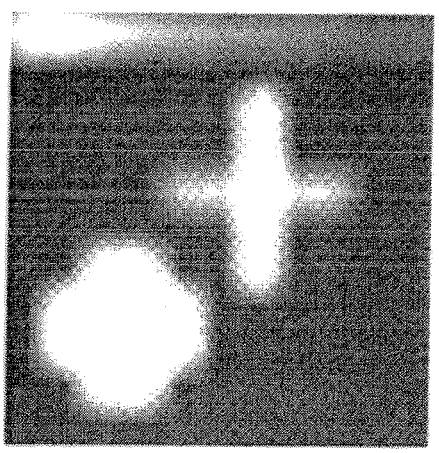

FIG. 5b illustrates the decoded image after having stored beforehand the acquired signal as a quaternion as described earlier and having solved the hypercomplex linear equation system. With this approach it is possible to lift the degeneration and reconstruct an image which is identical with the original without the drawbacks of the prior techniques. It should be noted that for storing still more information, it is sufficient to use higher order moments (derivative of the acceleration, etc.).

The invention claimed is:

1. A method for imaging an object according to a 2 D image comprising:
   generating a radiofrequency signal by a nuclear magnetic resonance device so that an object to be coded according to a 2 D image is exposed to a magnetic field;
   applying magnetic field gradients within the magnetic field according to two dimensions of the object to be coded;
   acquiring a complex signal during the application of the magnetic field gradients;
   determining, from the acquired complex signal, an associated hypercomplex signal, said associated hypercomplex signal being a function of the acquired complex signal, at least one component which is a time derivative of a phase of the acquired complex signal, and a 2 D vector; and
   processing of the thereby determined hypercomplex signal, the hypercomplex signal being a quaternion for obtaining the 2 D image coding of the object to be coded.

2. The method according to claim 1, further comprising a determining from the acquired signal a spatial density of each point of the acquired signal by solving in a hypercomplex space, a linear equation system formed by a hypercomplex vector formed by the acquired signal on the one hand, and by a hypercomplex matrix for coding the points of the space on the other hand.

3. A nuclear magnetic resonance imaging system, comprising means for applying the method according to claim 1.

4. A method for imaging an object according to a 2 D image comprising:
   generating a radiofrequency signal by a nuclear magnetic resonance device so that an object to be coded according to a 2 D image is exposed to a magnetic field;
   applying magnetic field gradients within the magnetic field according to two dimensions of the object to be coded;

acquiring a complex signal during the application of the magnetic field gradients;

determining, from the acquired complex signal, an associated hypercomplex signal, said associated hypercomplex signal being a function of the acquired complex signal, and at least one component which is a time derivative of a phase of the acquired complex signal; and storing the associated hypercomplex signal as a quaternium, and retrieving and processing the stored associated complex signal to obtain the 2 D image.

\* \* \* \* \*